US011177673B1

(12) United States Patent
Boxberger

(10) Patent No.: US 11,177,673 B1
(45) Date of Patent: Nov. 16, 2021

(54) ELECTRONIC DEVICE CHARGING APPARATUS THAT MAINTAINS PROPER ELECTRICAL POLARITY TO THE DEVICE

(71) Applicant: Frank Dale Boxberger, Scottsdale, AZ (US)

(72) Inventor: Frank Dale Boxberger, Scottsdale, AZ (US)

( * ) Notice: Subject to any disclaimer, the term of this patent is extended or adjusted under 35 U.S.C. 154(b) by 356 days.

(21) Appl. No.: 16/525,202

(22) Filed: Jul. 29, 2019

Related U.S. Application Data

(60) Provisional application No. 62/712,126, filed on Jul. 30, 2018.

(51) Int. Cl.
*H02J 7/00* (2006.01)
*H05K 5/02* (2006.01)

(52) U.S. Cl.
CPC ............ *H02J 7/0045* (2013.01); *H05K 5/023* (2013.01)

(58) Field of Classification Search
None
See application file for complete search history.

(56) References Cited

U.S. PATENT DOCUMENTS

| | | | | |
|---|---|---|---|---|
| 2007/0114969 A1* | 5/2007 | Marmaropoulos | ... | H02J 7/0027 320/108 |
| 2008/0311765 A1* | 12/2008 | Chatterjee | ............... | G06F 3/038 439/38 |
| 2010/0207771 A1* | 8/2010 | Trigiani | ................... | H02J 50/80 340/636.1 |
| 2012/0223673 A1* | 9/2012 | Chen | ....................... | H02J 7/342 320/108 |
| 2019/0103751 A1* | 4/2019 | Wang | ...................... | H01F 38/14 |

\* cited by examiner

*Primary Examiner* — Arun C Williams
(74) *Attorney, Agent, or Firm* — Plager Schack LLP; Mark H. Plager; Eric Liou

(57) ABSTRACT

A charging apparatus supplies power from a source to an electronic device with proper electrical polarity. The apparatus includes a base having a first magnetic member coupled to the source and corresponding to negative power and a second magnetic member coupled to the source and corresponding to positive power, and a charging case having a pair of metallic members coupled to an input of a bridge rectifier, a plug coupled to an output of the bridge rectifier by a first wire corresponding to negative power and a second wire corresponding to positive power. The plug connects to the electronic device and the charging case is maneuvered to engage the first metallic member with one of the magnetic members on the base and engage the second metallic member with the other magnetic member on the base. This connection supplies power from the source to the electronic device with proper electrical polarity.

10 Claims, 3 Drawing Sheets

ELECTRONIC DEVICE CHARGING APPARATUS THAT MAINTAINS PROPER ELECTRICAL POLARITY TO THE DEVICE

RELATED APPLICATION

The application claims priority to provisional patent application U.S. Ser. No. 62/712,126 filed on Jul. 30, 2018, the entire contents of which is herein incorporated by reference.

BACKGROUND

The embodiments herein relate generally to chargers for electronic devices. More specifically, embodiments of the invention are directed to an electronic device charging apparatus that maintains the proper electrical polarity to the charging device regardless of the connection to the power source.

Electronic devices such as cellular phones, smartphones, tablets and other portable and/or personal computing devices commonly are powered by an internal battery that needs to be charged. The electronic device is connected to a charger, which is typically connected by wire to a power outlet in a building, auxiliary power outlet in a vehicle, and the like. The charger needs to connect to the electronic device with the proper electrical polarity to ensure the battery of the electronic device will charge correctly. Therefore, it is necessary to connect the positive power and negative power lines of the charger to the electronic device's battery correctly for every charging operation.

As such, there is a need in the industry for an electronic device charging apparatus that maintains the proper electrical polarity to the charging device regardless of the connection and electrical polarity to the power source. This ensures the electronic device's battery will charge correctly, even when a user inadvertently connects the charger to the electronic device with the wrong electrical polarity.

SUMMARY

In certain embodiments of the invention, a charging apparatus for use to supply power from a source to an input power connector of an electronic device is provided. The charging apparatus is configured to supply the power to the electronic device with proper electrical polarity for a plurality of connections to the source having different electrical polarities. The charging apparatus comprises a base comprising a plurality of magnetic members secured thereto, the plurality of magnetic members comprising a first set of magnetic members electrically coupled to the source and corresponding to negative power and a second set of magnetic members electrically coupled to the source and corresponding to positive power, and a charging case coupled to the electronic device and comprising a pair of metallic members, a bridge rectifier and a plug coupled thereto, the pair of metallic members electrically coupled to an input of the bridge rectifier, the plug coupled to the input power connector of the electronic device and electrically coupled to an output of the bridge rectifier by a first wire corresponding to negative power and a second wire corresponding to positive power, wherein the charging case is configured to engage the first metallic member in the pair of metallic members with any magnetic member in the first set of magnetic members on the base and engage the second metallic member in the pair of metallic members with any magnetic member in the second set of magnetic members on the base, thereby supplying power from the source to the electronic device with proper electrical polarity.

In an alternative embodiment, the charging apparatus comprises a main base comprising a pair of magnetic members secured thereto where a first magnetic member is electrically coupled to the source and corresponding to negative power and a second magnetic member is electrically coupled to the source and corresponding to positive power.

BRIEF DESCRIPTION OF THE FIGURES

The detailed description of some embodiments of the invention will be made below with reference to the accompanying figures, wherein the figures disclose one or more embodiments of the present invention.

DETAILED DESCRIPTION OF CERTAIN EMBODIMENTS

Different embodiments of the invention are directed to an electronic device charging apparatus that maintains the proper electrical polarity to the device to be charged regardless of the connection and electrical polarity to the power source. In one embodiment, the electronic device charging apparatus allows the device to be placed in various locations on the apparatus with the electrical polarity in any direction. The apparatus automatically converts the electrical current to the proper electrical polarity before delivering the power to the battery of the electronic device. In embodiments of the invention, the charging apparatus can be used with any type of electronic device including, but not limited to, cellular phones, smartphones, tablets and other portable and/or personal computing devices.

Figure 1:
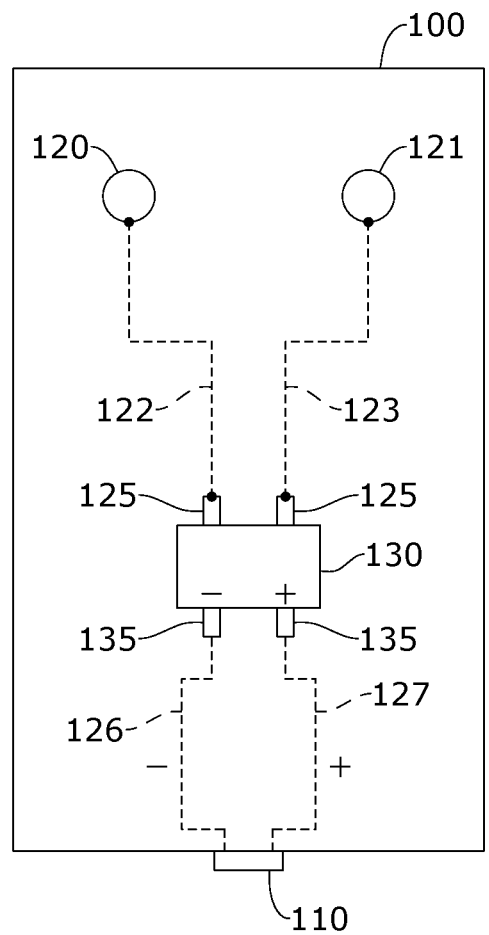
FIG. 1 depicts a schematic view of certain embodiments of the electronic device charging apparatus illustrating the charging case.
Figure 2:
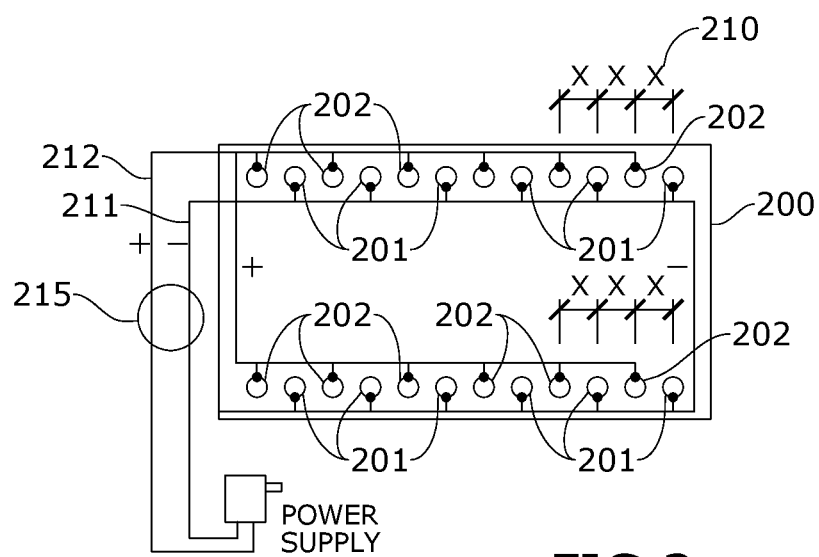
FIG. 2 depicts a top view of certain embodiments of the electronic device charging apparatus illustrating the charging base station.

In certain embodiments as depicted in FIGS. 1-2, the electronic device charging apparatus generally comprises case 100 and charging base station 200. Case 100 is configured to couple to the electronic device both mechanically and electrically. Case 100 is electrically coupled to charging base station 200 to charge the battery of the electronic device as will be described in more detail in the embodiments that follow.

In one embodiment as depicted in FIG. 1, case 100 comprises a body made from a non-conductive and non-magnetic material that connects to the electronic device. The body can snap on the electronic device or be secured thereon by other fastening components. In one embodiment, case 100 secures first metallic member 120 and second metallic member 121 therein so that first and second metallic members 120, 121 are exposed on the rear surface of case 100. In a preferred embodiment, metallic members 120, 121 comprise any metallic material such as steel or any other metal that is attracted to a magnetic member. However, first and second metallic members 120, 121 can be made from alternative materials.

In certain embodiments, bridge rectifier 130 and charging plug 110 are housed within case 100 and connected together. Specifically, bridge rectifier 130, also known as a diode bridge, is electrically coupled to first and second metallic members 120, 121. First metallic member 120 is electrically coupled to input 125 of bridge rectifier 130 by first wire 122 and second metallic member 121 is electrically coupled to input 125 of bridge rectifier 130 by second wire 123. Output 135 of bridge rectifier 130 is electrically coupled to charging plug 110. Specifically, output 135 of bridge rectifier 130 is electrically coupled to charging plug 110 by third wire 126 corresponding to negative power and fourth wire 127 corresponding to positive power. Charging plug 110 extends outside of case 100 and is configured to electrically couple to an input power connector of the electronic device (not shown).

Bridge rectifier 130 is configured to take any DC or AC current and rectify it to DC current of consistent electrical polarity. Therefore, the same electrical polarity at output 135 of bridge rectifier 130 is maintained regardless of the electrical polarity at input 125 of bridge rectifier 130. This allows third wire 126 to correspond consistently to negative power and fourth wire 127 to correspond consistently to positive power, which are properly oriented for the connection of charging plug 110 of case 100 to the input power connector of the electronic device.

In one embodiment as depicted in FIG. 2, charging base station 200 is configured to electrically couple to case 100. In certain embodiments, charging base station 200 comprises a base made from a non-metallic and non-magnetic material that secures a plurality of magnets thereto. The plurality of magnets comprise magnets 201 in a first set corresponding to negative power and magnets 202 in a second set corresponding to positive power. Magnets 201 in the first set are electrically coupled to a power supply by negative power wire 211 and magnets 202 in the second set are electrically coupled to the power supply by positive power wire 212. In one embodiment, the power supply is any source that provides 5V DC current.

In one embodiment, the magnets 201, 202 are exposed on the top surface of charging base station 200 so that any adjacent pair of magnets 201, 202 can engage with first and second metallic members 120, 121 of case 100. In a preferred embodiment as depicted in FIG. 2, the plurality of magnets 201, 202 are arranged linearly on charging base station 200 in an alternating pattern of one magnet from the first set of magnets 201 and one magnet from the second set of magnets 202. This ensures the arranged magnets 201, 202 provide alternating negative power and positive power contacts throughout charging base station 200.

The plurality of magnets 201, 202 can be any type of magnet including rare earth magnets such as neodymium magnets, or other types of magnets or magnetic materials. In one embodiment, each magnet 201, 202 comprises a diameter of approximately ¼"-1½" and spaced approximately distance 210 apart from each adjacent magnet. In one embodiment, distance 210 is approximately 1"-2", which is the same distance between first and second metallic members 120, 121 on case 100. However, the dimensions of magnets 201, 202 and spacing apart from each other can vary in alternative embodiments. It shall be appreciated that any number of magnets 201, 202 can be used on charging base station 200 and be arranged in various configurations.

In operation, charging base station 200 is placed in any position that exposes magnets 201, 202. In one embodiment, charging base station 200 is oriented horizontally on a table or other flat surface. In another embodiment, charging base station 200 is oriented vertically by hanging on a wall or other surface. Case 100 is coupled to the electronic device mechanically and electrically. The electrical connection is established by connecting charging plug 110 of case 100 to the input power connector of the electronic device (not shown).

Case 100 and the secured electronic device are maneuvered in any orientation such as upright, inverted, sideways, and the like, as long as first metallic member 120 on the rear surface engages with any magnet 201 in the first set and second metallic member 121 engages with any adjacent magnet 202 in the second set on charging base station 200. Alternatively, case 100 and the electronic device can be maneuvered so that first metallic member 120 engages with any magnet 202 in the second set and second metallic member 121 engages with any adjacent magnet 201 in the first set on charging base station 200.

It shall be appreciated that the attraction of first and second metallic members 120, 121 on case 100 to first and second magnets 201, 202 on base charging station 200 allows case 100 to be securely fastened to base charging station 200, regardless of the orientation of case 100.

In these connections, negative power and positive power will transmit from magnets 201, 202 on charging base station 200 through first and second metallic members 120, 121 on case 100 through first and second wires 122, 123 to bridge rectifier 130. Regardless of whether first wire 122 transmits negative power and second wire 123 transmits positive power, or vice versa, bridge rectifier 130 maintains a consistent electrical polarity through output 135 so that third wire 126 transmits negative power and fourth wire 127 transmits positive power to charging plug 110 of case 100. This allows charging plug 110 to deliver power consistently in the proper electrical polarity to the input power connector of the electronic device for all connections of case 100 and charging base station 200.

In one embodiment as depicted in FIG. 2, step-up voltage chip 215 is electrically coupled to first and second magnets 201, 202 on charging base station 200. Step-up voltage chip 215 is configured to increase the voltage that transmits to case 100 to account for the resistance present in bridge rectifier 130. In one exemplary embodiment, the electronic device's battery requires 5V. To account for this requirement, step-up voltage chip 215 increases the voltage from the power supply from 5V to approximately 6.2 V. After passing bridge rectifier 130 through the connections described, the voltage steps back down to 5V for the electronic device.

Figure 3A:
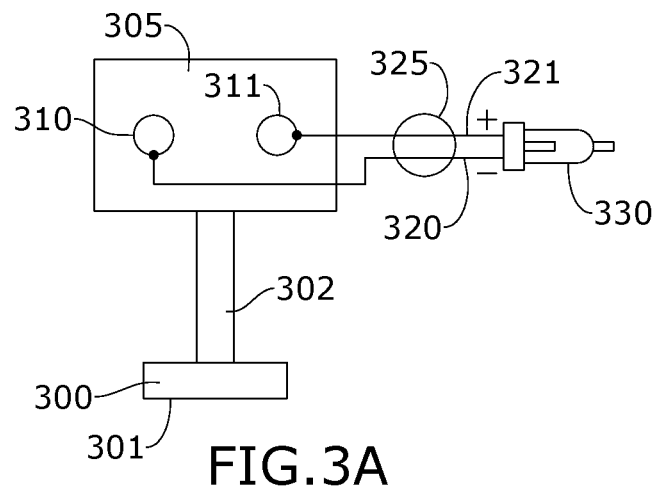
FIG. 3A depicts a front view of a first alternative embodiment of the electronic device charging apparatus illustrating the charging base station.
Figure 3B:
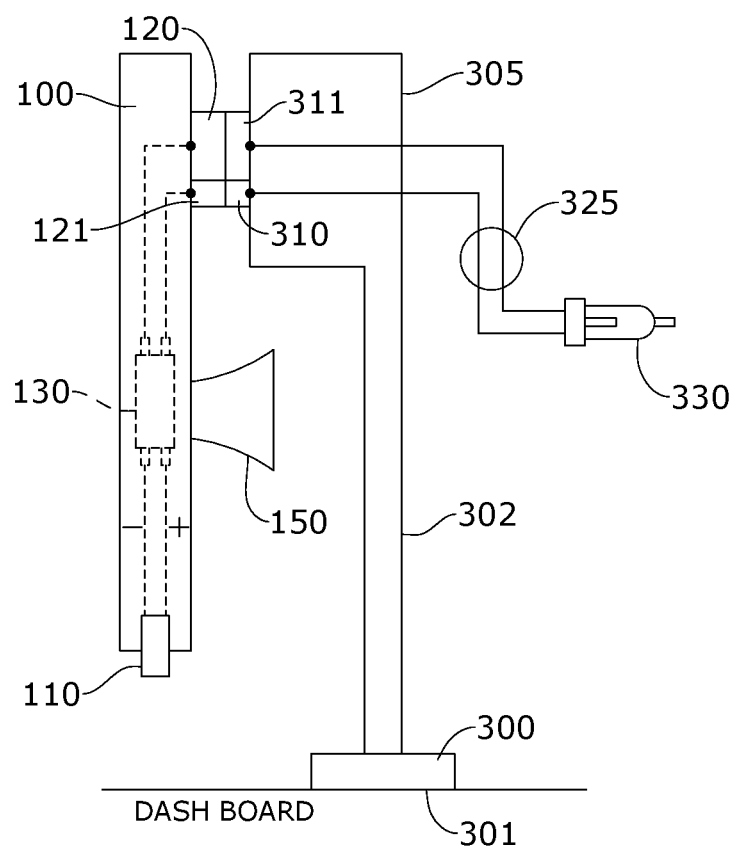
FIG. 3B depicts a side view of the first alternative embodiment of the electronic device charging apparatus illustrating the charging base station.

In alternative embodiments, case 100 can connect the electronic device to different charging base stations that comprise several components in charging base station 200. In an alternative embodiment as depicted in FIGS. 3A-3B, first alternate charging base station 305 is configured for use in a vehicle such as an automobile. First alternate charging base station 305 comprises a main base connected to support base 300 by arm 302. Support base 300 comprises mount surface 301 that is configured to attach to a dash board of the vehicle or alternative surface. In a preferred embodiment, the main base is made from any non-metallic and non-magnetic material. Support base 300 and arm 302 can be made from any materials known in the field, including but not limited to, plastic, wood, rubber, metal or other materials.

In certain embodiments as depicted in FIGS. 3A-3B, first alternate charging base station 305 comprises first magnet 310 corresponding to negative power and second magnet 311 corresponding to positive power. First magnet 310 is electrically coupled to charger plug 330 by negative power wire 320 and second magnet 311 is electrically coupled to charger plug 330 by positive power wire 321. First and second magnets 310, 311 are of the same type and dimensions as first and second magnets 201, 202 previously described. In one embodiment, step-up voltage chip 325 is electrically coupled to first and second magnets 310, 311.

The operation of the electronic device charging station having first alternate base charging station 305 and case 100 is operated in substantially the same manner as previously described. In one exemplary embodiment as depicted in FIG. 3B, first alternate charging base station 305 is mounted to the dash board of a vehicle. Charger plug 330 is coupled to an auxiliary power outlet in a vehicle such as a cigarette lighter socket. In one embodiment, a standard USB connector as is known in the field may be used to facilitate the connection of charger plug 330 to the vehicle's power outlet.

Case 100 is coupled to the electronic device mechanically and electrically. The electrical connection is established by connecting charging plug 110 of case 100 to the input power connector of the electronic device (not shown). Case 100 is maneuvered so that first metallic member 120 on the rear surface engages with either first magnet 310 or second magnet 311 on first alternate base charging station 305. Second metallic member 121 on case 100 engages with the remaining magnet, either first magnet 310 or second magnet 311. In one embodiment, case 100 comprises handle 150 to help a user to attach and remove case 100 from first alternate base charging station 305.

In this connection, power is transferred from the vehicle's power outlet to the electronic device. In the same manner described in other embodiments, regardless of whether first wire 122 transmits negative power and second wire 123 transmits positive power in case 100, or vice versa, bridge rectifier 130 in case 100 maintains a consistent electrical polarity through output 135 so that third wire 126 transmits negative power and fourth wire 127 transmits positive power to charging plug 110 of case 100. This allows charging plug 110 to deliver power consistently in the proper electrical polarity to the input power connector of the electronic device for all connections of case 100 and first alternate charging base station 305.

Figure 4:
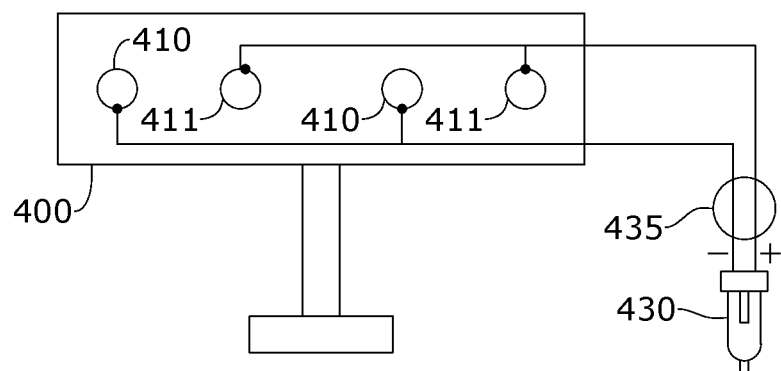
FIG. 4 depicts a front view of a second alternative embodiment of the electronic device charging apparatus illustrating the charging base station.

In alternative embodiments, any number of additional magnets can be used to accommodate additional electronic devices/cases or create more connection locations for case 100 as described in charging base station 200. FIG. 4 depicts an alternative embodiment of the charging base station for a vehicle having four magnets, which is operated in substantially the same manner as described in other embodiments. In this embodiment, second alternate charging base station 400 comprises first magnets 410 electrically coupled to charger plug 430 and corresponding to negative power and second magnets 411 electrically coupled to charger plug 430 and corresponding to positive power. In one embodiment, step-up voltage chip 435 is electrically coupled to first and second magnets 410, 411.

Figure 5A:
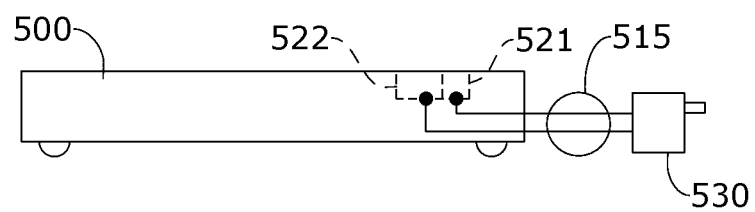
FIG. 5A depicts a side view of a third alternative embodiment of the electronic device charging apparatus illustrating the charging base station.
Figure 5B:
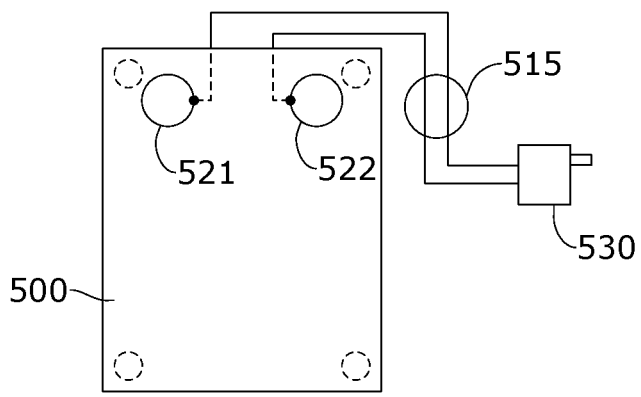
FIG. 5B depicts a top view of the third alternative embodiment of the electronic device charging apparatus illustrating the charging base station.

In an alternative embodiment as depicted in FIGS. 5A-5B, third alternate charging base station 500 is depicted, which comprises several of the same components previously described in several embodiments and is operated in substantially the same manner as previously described in other embodiments. Third alternate charging base station 500 is configured to be placed on a flat surface such as a table or other surface.

In one embodiment, third alternate charging base station 500 comprises a main base having first magnet 521 electrically coupled to charger plug 530 and corresponding to negative power and second magnet 522 electrically coupled to charger plug 530 and corresponding to positive power. In one embodiment, step-up voltage chip 515 is electrically coupled to first and second magnets 521, 522.

It shall be appreciated that the components of the electronic device charging apparatus described in several embodiments herein may comprise any alternative known materials in the field and be of any color, size and/or dimensions. It shall be appreciated that the components of the electronic device charging apparatus described herein may be manufactured and assembled using any known techniques in the field.

Persons of ordinary skill in the art may appreciate that numerous design configurations may be possible to enjoy the functional benefits of the inventive systems. Thus, given the wide variety of configurations and arrangements of embodiments of the present invention, the scope of the invention is reflected by the breadth of the claims below rather than narrowed by the embodiments described above.

What is claimed is:

1. A charging apparatus for use to supply power from a source to an input power connector of an electronic device, the charging apparatus configured to supply the power to the electronic device with proper electrical polarity for a plurality of connections to the source having different electrical polarities, the charging apparatus comprising:
   a base comprising a plurality of magnetic members secured thereto, the plurality of magnetic members comprising a first set of magnetic members electrically coupled to the source and corresponding to negative power and a second set of magnetic members electrically coupled to the source and corresponding to positive power; and
   a charging case coupled to the electronic device and comprising a pair of metallic members, a bridge rectifier and a plug coupled thereto, the pair of metallic members electrically coupled to an input of the bridge rectifier, the plug coupled to the input power connector of the electronic device and electrically coupled to an output of the bridge rectifier by a first wire corresponding to negative power and a second wire corresponding to positive power;
   wherein the charging case is configured to engage the first metallic member in the pair of metallic members with any magnetic member in the first set of magnetic members on the base and engage the second metallic member in the pair of metallic members with any magnetic member in the second set of magnetic members on the base, thereby supplying power from the source to the electronic device with proper electrical polarity.

2. The charging apparatus of claim 1, wherein the charging case is configured to engage the first metallic member in the pair of metallic members with any magnetic member in the second set of magnetic members on the base and engage the second metallic member in the pair of metallic members with any magnetic member in the first set of magnetic members on the base, thereby supplying power from the source to the electronic device with proper electrical polarity.

3. The charging apparatus of claim 2, further comprising a step-up voltage chip electrically coupled to the magnetic members in the first and second sets of magnetic members.

4. The charging apparatus of claim 3, wherein the plurality of magnetic members are arranged linearly on the base in an alternating pattern comprising of one magnetic member from the first set of magnetic members and one magnetic member from the second set of magnetic members.

5. A charging apparatus for use to supply power from a source to an input power connector of an electronic device, the charging apparatus configured to supply the power to the electronic device with proper electrical polarity for a plurality of connections to the source having different electrical polarities, the charging apparatus comprising:
- a main base comprising a pair of magnetic members secured thereto, the pair of magnetic members comprising a first magnetic member electrically coupled to the source and corresponding to negative power and a second magnetic member electrically coupled to the source and corresponding to positive power; and
- a charging case coupled to the electronic device and comprising a pair of metallic members, a bridge rectifier and a plug coupled thereto, the pair of metallic members electrically coupled to an input of the bridge rectifier, the plug coupled to the input power connector of the electronic device and electrically coupled to an output of the bridge rectifier by a first wire corresponding to negative power and a second wire corresponding to positive power;

wherein the charging case is configured to engage the first metallic member in the pair of metallic members with the first magnetic member on the main base and engage the second metallic member in the pair of metallic members with the second magnetic member on the main base, thereby supplying power from the source to the electronic device with proper electrical polarity.

6. The charging apparatus of claim 5, wherein the charging case is configured to engage the first metallic member in the pair of metallic members with the second magnetic member on the main base and engage the second metallic member in the pair of metallic members with the first magnetic member on the main base, thereby supplying power from the source to the electronic device with proper electrical polarity.

7. The charging apparatus of claim 6, further comprising a step-up voltage chip electrically coupled to the first and second magnetic members.

8. The charging apparatus of claim 7, further comprising a handle coupled to the charging case.

9. The charging apparatus of claim 7, further comprising a support base coupled to the main base.

10. The charging apparatus of claim 9, further comprising an arm connecting the support base to the main base.

* * * * *